United States Patent
Bruyn

(10) Patent No.: US 6,943,541 B2
(45) Date of Patent: Sep. 13, 2005

(54) APPARATUS AND METHOD FOR TESTING CIRCUIT MODULES

(75) Inventor: Joost Bruyn, Ermelo (NL)

(73) Assignee: RENTEC B.V., Ermelo (NL)

( * ) Notice: Subject to any disclaimer, the term of this patent is extended or adjusted under 35 U.S.C. 154(b) by 43 days.

(21) Appl. No.: 10/472,712

(22) PCT Filed: Mar. 20, 2002

(86) PCT No.: PCT/NL02/00181
§ 371 (c)(1),
(2), (4) Date: Jan. 20, 2004

(87) PCT Pub. No.: WO02/075342
PCT Pub. Date: Sep. 26, 2002

(65) Prior Publication Data
US 2004/0119489 A1 Jun. 24, 2004

(30) Foreign Application Priority Data
Mar. 20, 2001 (NL) .............................................. 1017656

(51) Int. Cl.⁷ .......................... G01R 31/26; B07C 5/344
(52) U.S. Cl. ..................... 324/158.1; 324/765; 209/573
(58) Field of Search ................................ 324/754–755, 324/765, 158.1; 209/352, 571, 573, 909–911; 414/222.09, 222.1, 225.01, 226.01, 226.02, 751.1, 752.1, 753.1

(56) References Cited

U.S. PATENT DOCUMENTS

| 5,601,396 | A | | 2/1997 | Staub |
| 5,954,205 | A | * | 9/1999 | Smith ............................ 209/2 |
| 6,089,635 | A | | 7/2000 | Lee |
| 6,469,496 | B1 | * | 10/2002 | Khouw et al. ........... 324/158.1 |
| 6,507,185 | B1 | * | 1/2003 | Hennekes et al. ....... 324/158.1 |

FOREIGN PATENT DOCUMENTS

JP 2000329819 11/2000

* cited by examiner

Primary Examiner—Paresh Patel
(74) Attorney, Agent, or Firm—Merchant & Gould P.C.

(57) ABSTRACT

Circuit modules comprise a carrier surface with components mounted thereon. A testing apparatus for these modules comprises a magazine for hosting a row of circuit modules. The row is pushed into a gripper of a pickup mechanism by means of a press-on member. As a consequence, the orientation of the magazine can be horizontal. The gripper removes the gripped modules in a direction in line with the row. The press-on member preferably comprises a rotatable press-on plate which rotates along with the row of modules if it starts to fan out, but at the same time pushes the row back so that significant fanning is prevented.

16 Claims, 5 Drawing Sheets

APPARATUS AND METHOD FOR TESTING CIRCUIT MODULES

FIELD OF THE INVENTION

This invention relates to an apparatus and method for manipulating and testing circuit modules each comprising a carrier surface with components arranged thereon. The invention relates in particular to the testing of memory modules for PCs (Personal Computers). Examples of such memory modules are known under the name of SIMMs, DIMMs, etc.

BACKGROUND OF THE INVENTION

Memory modules are tested before they are mounted in PCs or sold. Such testing is preferably done in an automated manner and in serial production, with a number of modules being introduced simultaneously into a testing apparatus, to be subsequently contacted one by one with electrical testing terminals for performing a functional test. Depending on the result of the test, the modules are subsequently sorted into properly working and improperly working modules. U.S. Pat. No. 5,704,489 discloses an apparatus for testing memory modules. This apparatus comprises a magazine into which a plurality of modules stacked onto each other can be introduced. This magazine stands substantially vertically on the apparatus, so that the stack of memory modules rests on the underside of the magazine. At the underside of the magazine is a mechanism for dropping the modules one by one from the magazine onto a table. On the table is a slide which proceeds to push the modules into the test terminals.

The apparatus of U.S. Pat. No. 5,704,489 is of modular design, so that it is suitable to be converted if after handling a first batch of memory modules of a first type, a second batch of memory modules of a second type having different dimensions or a different connection are to be tested.

The apparatus mentioned has a number of disadvantages. Firstly, the number of memory modules that can be simultaneously placed in the magazine is rather limited, in particular if modern types of memory modules are involved. This is because these modern types of modules comprise, on the carrier surface thereof, adjacent the edge of the carrier surface, a component (an EPROM) which projects higher above the carrier surface than the other components. As a consequence, the memory modules fan out when being stacked: the stack becomes highest on the side of the projecting component and much lower on the opposite side. If significant fanning is involved, that is, fanning through a large angle and/or cumulative fanning of more than a few a circuit modules, this limits the maximum number of memory modules that can be properly stacked. Further, the weight of high stacks presses onto the lower modules, which are supported only on the sides and therefore may easily be damaged. This also limits the number of modules that can be stacked.

Secondly, the known machine has the disadvantage that the modules, by falling onto the table, can get damaged. Thirdly, the resetting in between batches of different types, despite the modular design, is still considerable, because the height of the table must be adjusted to the height of the components on the carrier surface. Fourthly, the mechanism of the known machine does not allow modules that differ mutually in the height of the components on them, to be jointly placed in the magazine for testing. Fifthly, the mechanism of the known machine only lends itself for testing one module at a time.

SUMMARY OF THE INVENTION

It is one object of the invention to provide an apparatus and method for testing circuit modules in which a larger number of circuit modules can be placed in the magazine. It is another object of the invention to provide an apparatus and method for test circuit module in which the chance of damage to the circuit modules is reduced.

It is a further object of the invention to provide an apparatus and method for testing circuit modules in which the resetting times are shortened.

The invention provides an apparatus for testing circuit modules each comprising a carrier surface with components mounted thereon, which apparatus is provided with:
- a magazine for hosting a row of circuit modules with the carrier surfaces onto each other;
- a pickup mechanism for separating an individual circuit module from the row for connecting the individual circuit module to test terminals for performing a functional test on the individual circuit module;
- a press-on member for pressing on the row in a direction towards the pickup mechanism, the press-on member exerting a press-on force on the carrier surface of a circuit module at an end of the row in the magazine.

By pressing on the row of modules with the press-on member, significant fanning is prevented. As a result, a larger number of modules can be placed in the magazine. Preferably, the magazine is placed substantially horizontally, so that the force which the modules exert onto each other originates substantially from the press-on member and not from the weight of the stacked modules. This reduces the chance of damage.

In an apparatus according to an embodiment of the invention, the pickup mechanism comprises a gripper into which the circuit modules are pushed by the press-on member. Thus, the gripper itself does not need to perform the pickup movement, which renders the gripping of the circuit module more reliable, with less risk of damage.

In an embodiment, the gripper, with a gripped module, moves away from the row at least for a part in the direction of the prolongation of the row (that is, along the direction of the press-on force). The gripper too is preferably carried to the row in this direction for the purpose of gripping. Alternatively, the gripper could move the gripped module transversely to the row, that is, in a direction parallel to the carrier surface, but this leads to a greater chance of damage in that components on the different modules thus move along each other. Likewise, if the gripper were to approach the row in this transverse direction, the chance of incorrect gripping is greater.

In an embodiment of the apparatus according to the invention, the gripper comprises a yoke which further serves as a stop to hold the row of modules when the gripper is in front of the row. The yoke only engages the edge of the carrier surface of the front module in the row. Thus, different types of modules, with components or other elevations of different heights can be handled without the apparatus needing to be reset for the purpose. Further, the gripper is preferably provided with movable jaws to clamp the module in the gripper and with cams which engage in standardized recesses in memory modules for PCs. As a result, the risk of a module falling from the gripper is virtually precluded.

Preferably, the apparatus according to the invention comprises a clamping device to clamp one or more modules which are immediate neighbors of the gripped module when the gripper moves away from the row. Alternatively, knives could be used which are moved partly between the gripped module and its immediate neighbor, but the clamping device requires less space between the modules and prevents tilting of the modules, which may happen when using knives between the modules.

In an apparatus according to an embodiment of the invention, the press-on member comprises a press-on plate which is rotatable, so that it rotates along if the modules were to fan out. What is prevented by the rotation is that the press-on plate presses onto a fixed point. In an embodiment, the magazine comprises a guide profile about which the modules hinge if they fan out. The rotation axis of the press-on plate is preferably so positioned that the plate, if it rotates along, presses on that side of this "hinge" where the row, upon fanning out, becomes thickest.

The press-on plate is preferably adapted to be swung clear and back again, so that if behind the press plate additional modules are loaded into the magazine (into a loading space where they are not pressed upon yet), the press-on plate can be swung clear from behind the row and can be swung back in again behind the loaded addition modules. Thus, minimal interruption is required for loading additional modules. Preferably, the magazine comprises side guides, which engage in notches on the side of the modules to prevent the modules from being pressed out of the row. To facilitate loading, these side guides preferably do not continue into the loading space.

These and other objects and advantages of the apparatus and method according to the invention will be further described with reference to the following figures.

DETAILED DESCRIPTION OF THE INVENTION

Figure 1:
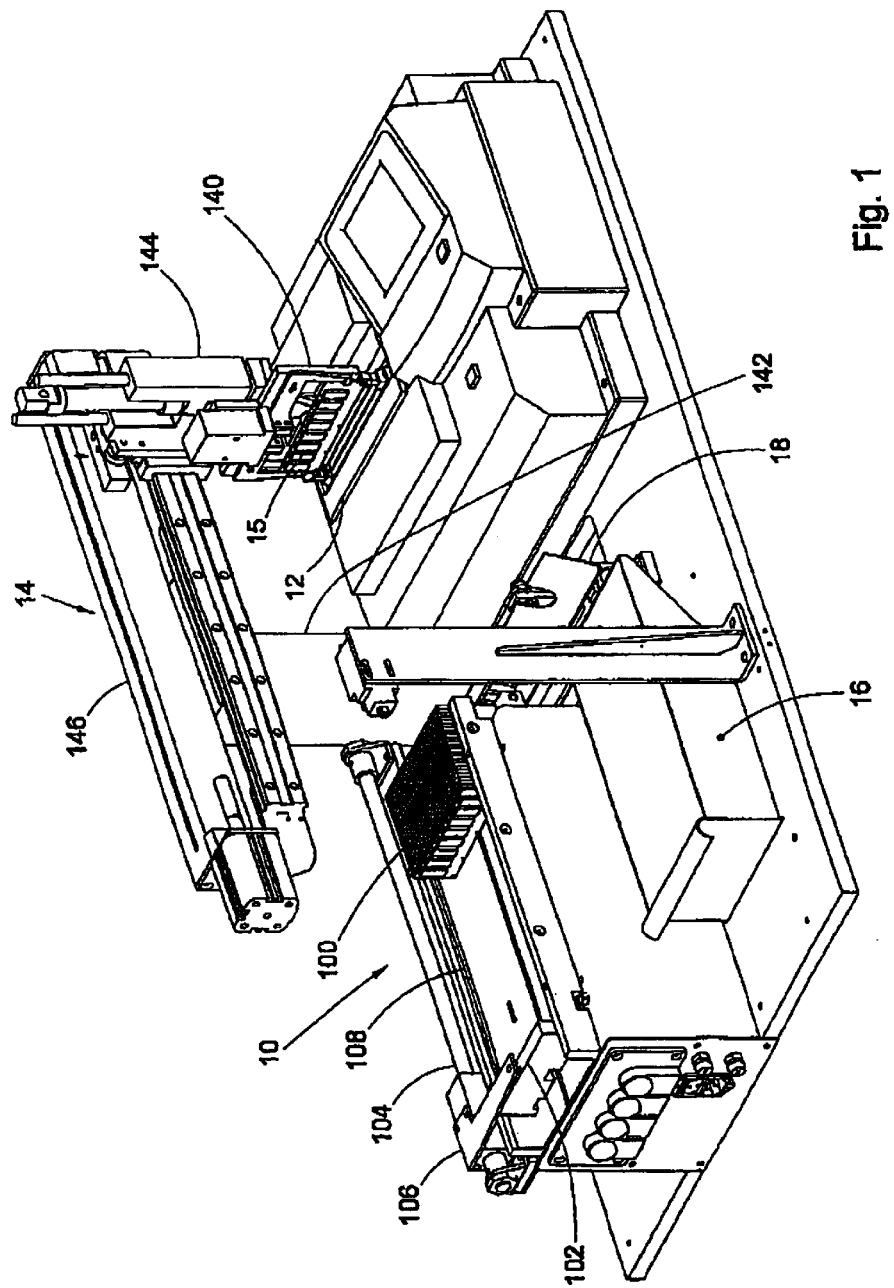
FIG. 1 shows an overview of the apparatus according to the invention.

FIG. 1 shows an overview of the apparatus. The apparatus comprises a magazine 10, a test connector 12, a transport mechanism 14, a discharge bin 16 and a discharge mechanism 18. Shown in the magazine 10 are a row of memory modules 100. Further, the apparatus comprises a press-on plate 102 in the magazine 10, a piston 104 for energizing the press-on plate 102 and a swinging connection 106 between the piston 104 and the press-on plate 102. Arranged along the walls of the magazine 10 are profiles 108. The transport mechanism 14 comprises a gripper 140, a support 142, a vertical actuator 144 and a horizontal actuator 146. Shown in the gripper 140 is a circuit module 15. Further, the apparatus comprises a control computer (not shown) for the coordination and inspection of the operation of the different parts.

In use, a row of circuit modules 100 is placed in the magazine 10, for instance by an operator. The press-on plate 102 pushes the row of modules 100 to an end of the magazine 10. The transport mechanism 14 brings the gripper 140 to the end of the magazine 10, where the gripper grips a circuit module from the row 100. The transport mechanism 14 then moves the circuit module 15 in the gripper 140 to the test connector 12 and pushes the circuit module 15 into the test connector 12.

Via the test connector 12, a series of signals are sent to the module 15 and response signals from the module 15 are read out to test the electronic functionality of the circuit module 15. This is done, for instance, by means of a test process that is known per se. The specific test process is not relevant to the invention.

Upon completion of the test process, the transport mechanism 14 moves the gripper 140, with the circuit module 15 therein, to discharge mechanism 16, in which the gripper 140 deposits the module. The discharge mechanism 18 comprises, for instance, two conveyor belts, a first one for circuit modules 15 which have been found in order in the test process and a second one (not shown) for circuit modules 15 which have not been found in order. The discharge mechanism 16 transports the module 15 to discharge bin 16 for modules found in order or to a further discharge bin (not shown) for modules not found in order. As an alternative to discharge bins, also intermittent belts can be mounted (not shown). On these, the modules 15 are stacked overlapping like roof-tiles.

Figure 2:
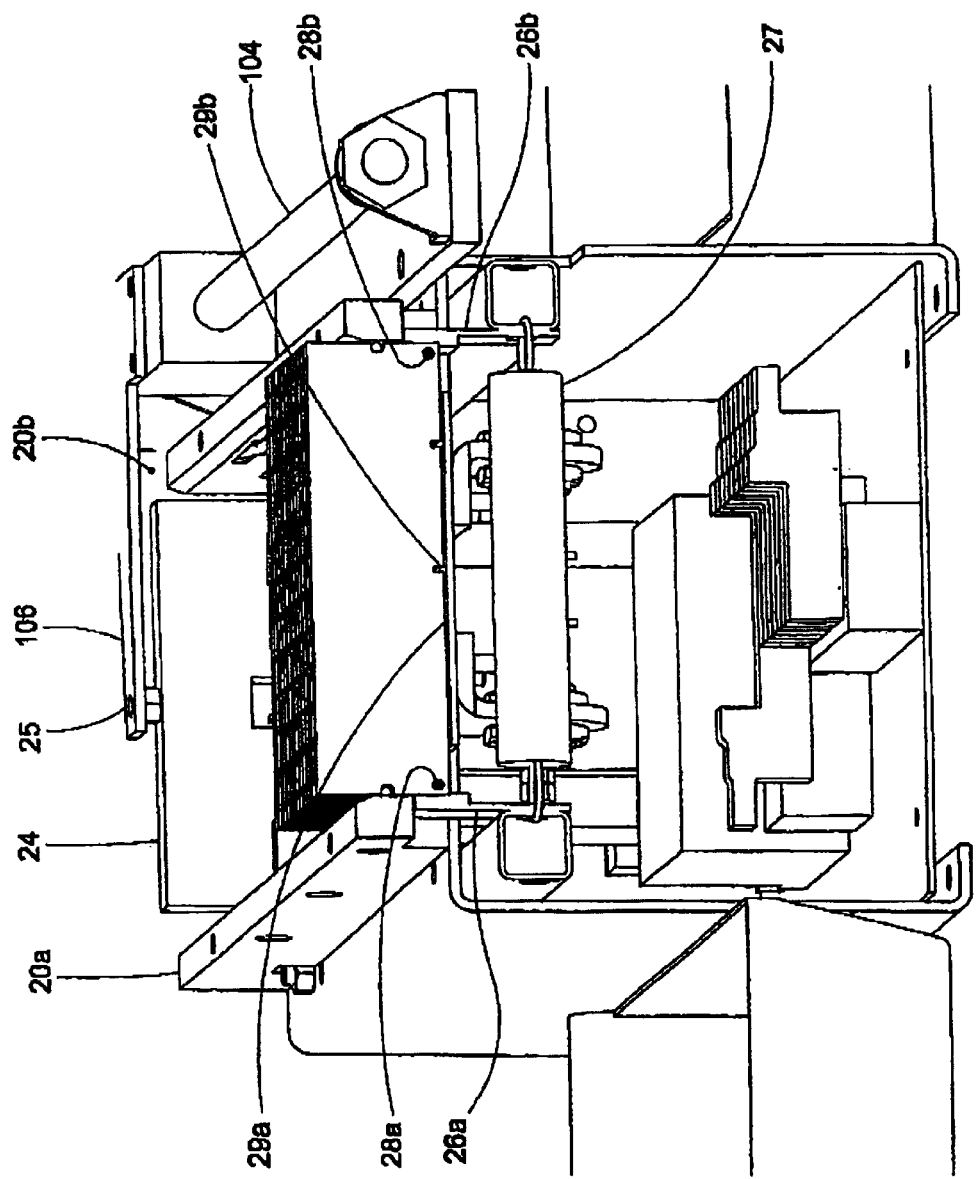
FIG. 2 shows an overview of the magazine.

FIG. 2 shows the magazine portion of the apparatus in more detail. Shown are guides 20a, b, a row of circuit modules 22, press-on plate 24, clamps 26a, b, a draw spring 27, profiles 28a, b provided on guides 20a, b, and a bottom plate 29a of the magazine with a profile 29b arranged thereon.

In use, the press-on plate 24 serves to push the row of circuit modules 22 in the direction of the viewer of FIG. 2 (to the "front" of FIG. 2). Although FIG. 2, for the sake of visibility, shows the press-on plate 24 at some distance from the row of modules 22, this press-on plate 24 will operatively abut against the row of circuit modules 22 (at the "back" in FIG. 2). From piston 104, via connection 106, a force of, for instance, 10 Newton is exerted on the press-on plate 24. The press-on plate 24 thus pushes the circuit modules 22 forwards. At the front, the circuit modules 22 are stopped by the gripper (not shown in FIG. 2). This will be discussed further hereinafter. During pushing, the guides 20a, b guide the circuit modules on the sides, and the bottom plate 29a guides the circuit modules from below.

The carrier surfaces (generally PCBs) of memory modules for PCs include recesses at standardized positions. At positions where these recesses are located in the circuit modules in the row 22, profiles 28a, b, 29b are arranged which continue from the front to the back (the profiles 28a, b do not continue all the way to the back of the magazine). The profiles 28a, b, 29b aid in guiding the circuit modules. The profiles 28a, b on the side guides (and the side guides themselves) chiefly serve to prevent, if necessary, movement of the circuit modules 22 in vertical direction. Preferably, there is only one profile 29a on the bottom plate; more profiles can give rise to the danger of jerking. Press-on plate 24 prevents fanning of the circuit modules 22. The fact is that many memory modules for PCs comprise a relatively high component (an EPROM) on the carrier surface and in the vicinity of the edge thereof. The relatively high component is higher than the other components on the carrier surface. Due to this high component, the circuit modules in the row of circuit modules 22 tend to skew, so that the row 22 on one side, for instance on the side of a first guide 20b, continues further backwards than on the side of the second guide 20a. In the magazine, the circuit modules hinge about the profile 29b in the bottom plate. The press-on plate 24 presses on the circuit modules 22 at least at a point between the profile 29b in the bottom plate 29a and the high component. The exact location of this point depends on where the plate touches the components on the carrier surface. As a consequence, the row of circuit modules 22 is pressed upon without the modules essentially fanning.

The press-on plate 24 is preferably rotatably mounted about an axis 25 which is located substantially above the profile 29b, centrally between the guides 20a, b. Due to its rotatability, the press-on plate 24 can rotate along if the circuit modules fan initially or later to a minor extent. The press-on force is thus concentrated in the vicinity of the center. It has been found that in the case of a non-rotatable press-on plate 24, under some circumstances, with some types of circuit modules, there is a risk of the circuit modules being pushed out of the row 22. Presumably, this is because the point of action where the press-on plate 24 exerts force on the circuit module is displaced, due to the rotation, in the direction of the side of the row of circuit modules 22 where it is thickest due to fanning. (This point of action depends on the components on the circuit modules, but is in the vicinity of a point from which the normal to the carrier surface points to the center of the axis 25.) As long as the center of the axis 25 does not lie further from the profile 29b on the bottom plate 25 than the distance between this center and the contact face of the press-on plate 25 that is in contact with the row of circuit modules, different types of circuit modules with all kinds of unevenness can be handled. However, if it is known that the circuit modules all have their highest point on one side of the carrier surface, the center of the axis can also be placed between the profile and that side of the carrier surface. A use of a press-on plate 24 of a thickness of from 1 to 2 cm is preferred to obtain a favorable pressure point on the row 22. Preferably, at least the edges of the contact face of the press-on plate 24 that is in contact with the row of circuit modules (at least the edges proximal to the guides 20a, b) are rounded off, or provided with obtuse angles, such that they do not hook on the edge of components on the carrier surface of a circuit module, but slide over it.

Preferably, it is possible to load new circuit modules into the magazine while the apparatus is operating normally and hence press-on plate 24 is pressing on a row of circuit modules 22. To that end, the combination of piston 104 and connection 106 is adapted to be swung clear. If for instance an operator has loaded circuit modules behind the press-on plate 24, the pressure is removed from the piston 104, and the operator swings the press-on plate 24 clear from the space between the guides 20a, b. The operator proceeds to slide the press-on plate 24 to a point behind the newly loaded circuit modules and swings the press-on plate 24 back between the guides 20a, b again. Thereupon the pressure against the piston 104 is built up again. This is preferably done gradually, over a period of 10 seconds to 1 minute, which reduces the risk of misalignment of circuit modules.

Preferably, the profiles 28a, b on the guides 20a, b do not continue all the way to the rear side of the magazine, but leave clear a loading space without profiles on the side guides in the magazine. As a result, it is possible to load the magazine at the back from above by placing circuit modules between the guides. Further, the bottom plate 29a in the loading space preferably has more than one profile 29b. In this way, modules 22 can only be loaded into the magazine to stand level along their length if they are properly oriented, that is, not rotated through 180° about the vertical axis. Further, the circuit modules cannot at that point come to stand askew in the magazine. Only one of these profiles 29b on the bottom plate 29a continues into that part of the magazine where the press-on plate 24 is operative. This prevents jamming of the circuit modules there.

Preferably, the position of the side guides 20a, b and clamps 26a,b is adjustable to different types of circuit modules, each type having a different width. Press-on plate 24 does not need to be adjustable and can merely have a width of less than the width of circuit modules of the narrowest type. It has been found that in that case too the pushing mechanism works satisfactorily.

Figure 3:
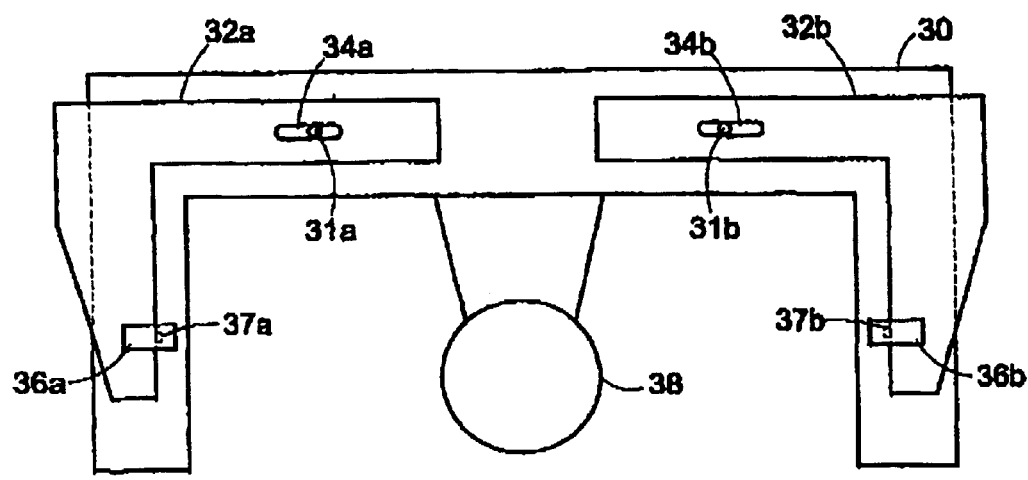
FIG. 3 shows a side elevation of the gripper.

FIG. 3 shows a front view of the gripper. The gripper comprises a yoke 30, on which movable gripper jaws 32a, b are mounted. Further, fitted to the gripper is a block 38 on an adjusting screw. The gripper comprises an energization (not shown) to reciprocate the gripper jaws 32a, b along the yoke (to the left and right in FIG. 3). Provided on the yoke 30 are pins 31a, b and provided in the gripper jaw are slots 34a, b to guide the movement. Provided on the gripper jaws 32a, b are lips 36a, b. Arranged between the lips 36a, b and the yoke 30 are profiles (cams) 37a, b. Preferably, the profiles 37a, b are arranged on the movable gripper jaws 32a, b, but alternatively the profiles 37a, b can be arranged on the yoke 30.

Figure 4:
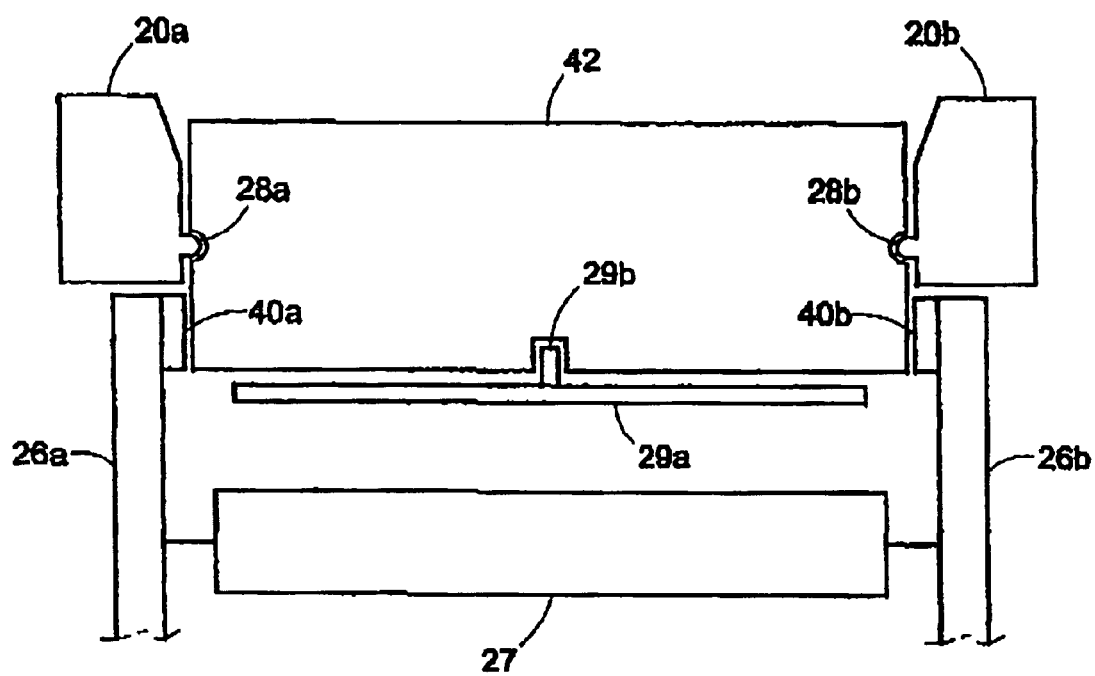
FIG. 4 shows a front view of the magazine.

FIG. 4 shows a front view of the magazine. The front view shows the guides 20a, b, the profiles 28a, b, the bottom plate 29a, and the profile 29b, the spring 27, clamps 26a, b, with rubbers 40a, b thereon and a circuit module 42.

Figure 5:
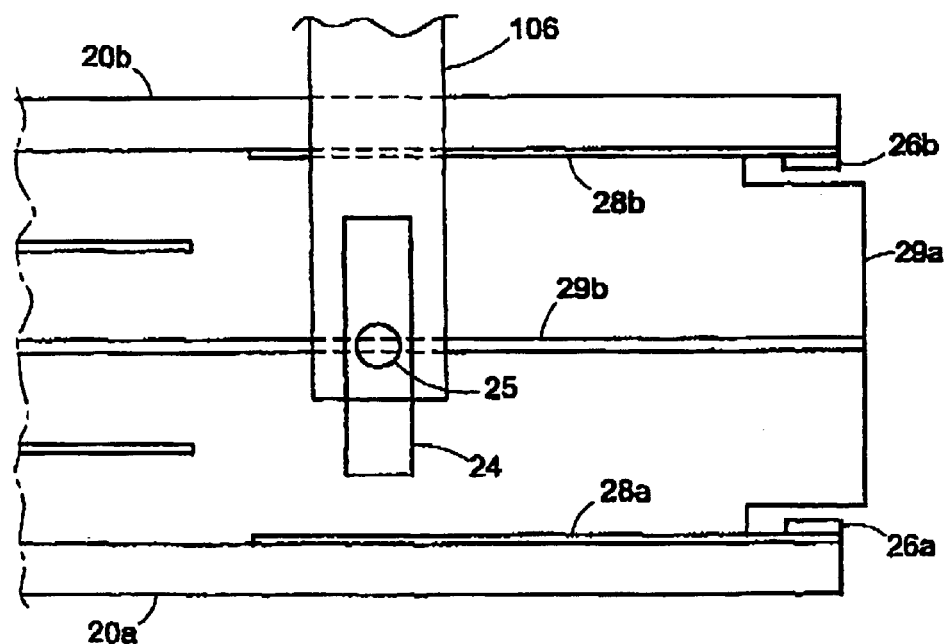
FIG. 5 shows a top plan view of the magazine.

FIG. 5 shows a top plan view of the magazine. The top plan view shows guides 20a, b, press-on plate 24, axis 25, connection 106, profiles 28a, b, bottom plate 29a, profile 29b and clamps 26a, b.

Figure 6:
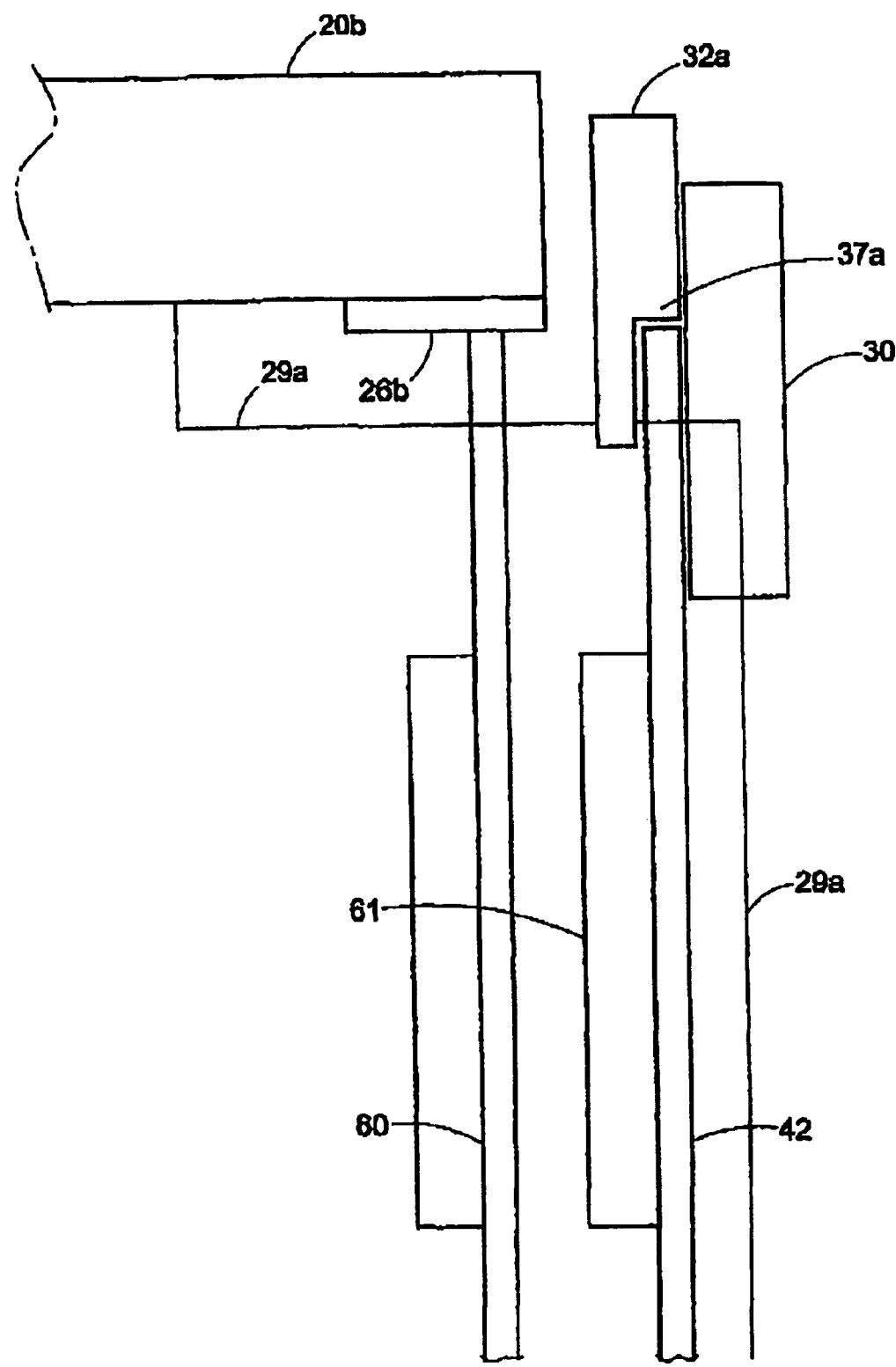
FIG. 6 shows a detail of the magazine in top plan view.

FIG. 6 shows an enlarged quasi cross section (parts not to scale) of a corner of the magazine in combination with the gripper in top plan view. Of the magazine are shown: one of the guides 20b, one of the clamps 26a, b, the bottom plate 29a. Of the gripper 140, there are shown cross sections of the yoke 30 and of the movable gripper jaw 32a. Further shown is the circuit module 42, with a component 61 thereon. Finally, a next circuit module 60 is shown.

In operation, transport mechanism 14 brings the gripper 140 opposite the mechanism as shown in FIG. 6, that is, such that the surface of the yoke 30 proximal to the circuit modules 42, 60 is above the bottom plate 29a. The yoke 30 projects into the space formed beyond and in line with the guides 20a, b, so that the yoke constitutes a stop against which the circuit module 42 is pressed by the press-on plate 24 via the row of circuit modules 22. As a result, the circuit module 42 cannot be pressed beyond the yoke 30. The yoke 30 only projects by a limited distance into the space formed beyond and in line with the guides 20a, b, specifically not so far that it touches any component 61 on the circuit module 42.

Initially, the gripper jaws 32a, b are slid outwards, and the clamps 26a, b are pushed outwards (by an actuator not shown). Thus, the circuit module 42 can be pushed beyond the lips 36a, b, with its carrier surface against yoke 30. The block 38 prevents the circuit module 42 from bending in the middle. If desired, the block 38 can be adjusted to the height of the components on the circuit module 42, but in practice this has been found to be hardly necessary.

Next, the clamps 26a, b are no longer pushed outwards. These clamps 26a, b are now pulled towards each other by the draw spring 27, so that they clamp next circuit modules 60 succeeding the circuit module 42 which is being pressed against the yoke (only one next circuit module is shown).

Also the gripper jaws 32a, b are moved towards each other, so that the lips 36a, b move over the carrier surface of circuit module 42. The profiles 37a, b in the gripper engage in the recesses of the circuit module 42 which were guided earlier by side profiles 28a, b (side profiles 28a, b do not project outside guides 20a, b). As a result, the circuit module 42 is fixed in the gripper. The transport mechanism 14 thereupon moves the gripper 142 with the circuit module 42 away from the magazine, in a direction in line with the row, that is, such that the distance between the carrier surfaces of the gripped circuit module 42 and the next circuit module 60 from the row increases upon initiation of the movement of the circuit module 42 out of the row. Thus, there is no contact between these modules 42, 60 during movement, and hence no chance of damage (naturally, the direction of movement does not need to be entirely in line with the row, as long as the direction of movement has a component in line with the row.) Next, the transport mechanism 14 moves the gripper to the test connector 12, and pushes the circuit module 42 into the connector 12 for the test. The clamps 26a, b remain pulled towards each other, as long as the gripper is not in front of the magazine, and thereby prevent the next circuit module 60 from falling out of the magazine. In principle, every time when a module has been tested, the gripper 140 can be moved back to the magazine, while the tested modules adjacent to the magazine are placed on the discharge mechanism which is controlled depending on the result of the test. Thus, the discharge of modules does not require any additional movements of the transport mechanism. Without departing from the invention, however, a plurality of test connectors 12 can be used, with the gripper picking up consecutive circuit modules and placing them in test connectors while circuit modules are being tested in one or more other test connectors.

It will be clear that the apparatus shown enables serial testing of circuit modules and specifically memory modules for PCs, without the circuit modules needing to fall out of the magazine to be processed. No use is made of gravity. All forces that are needed for processing can be accurately controlled and are hardly, if at all, dependent on the number of circuit modules standing in the magazine.

What is claimed is:

1. An apparatus for testing circuit modules each comprising a carrier surface with components mounted thereon, which apparatus is provided with:
   a magazine for accommodating a row of circuit modules with the carrier surfaces onto each other;
   a pickup mechanism for separating an individual circuit module from the row for connecting the individual circuit module to test terminals for performing a functional test on the individual circuit module;
   a press-on member for pressing on the row in a direction towards the pickup mechanism, the press-on member exerting a press-on force on the carrier surface of a circuit module at an end of the row in the magazine.

2. An apparatus according to claim 1, wherein the magazine is disposed such that a normal to the carrier surfaces of the modules in the row is oriented substantially perpendicularly to the force of gravity.

3. An apparatus according to claim 1, wherein the pickup mechanism is provided with a gripper and is arranged to position the gripper, during pickup, relative to the magazine, such that a further circuit module at a further end of the row is pushed into the gripper by the press-on force.

4. An apparatus according to claim 3, wherein the pickup mechanism is arranged to move the further module gripped in the gripper, away from the row in a direction having at least a component in line with the row.

5. An apparatus according to claim 3, wherein the gripper comprises a yoke against which the press-on force pushes up the further circuit, the yoke including a recess, such that only of the further circuit module only opposed edge portions of the carrier surface on which no components are arranged are pushed up against the yoke.

6. An apparatus according to claim 5, wherein on the yoke movable gripper jaws are mounted which are arranged, after the further circuit module has been pushed against the yoke, to move towards each other to embrace at least the edge portions of the carrier surface.

7. An apparatus according to claim 3, for testing circuit modules which include a notch in each of the edge portions, wherein the gripper includes cams to engage in the notches.

8. An apparatus according to claim 3, provided with an energizable clamping device for clamping opposed edges of the carrier surface of one or more of the circuit modules at the further end of the row next to the further circuit module, the apparatus being arranged to energize the claming device at least when the gripper is not in front of the magazine and to release the clamping device during a period of the time when the gripper is in front of the magazine.

9. An apparatus according to claim 1, wherein the press-on member comprises a plate for transmitting a press-on force onto the carrier surface of the circuit module at the end of the row, the plate being rotatable about a rotation axis parallel to the carrier surface of the circuit modules at the end of the row.

10. An apparatus according to claim 9, for testing circuit modules having a notch in an edge of the carrier surface, wherein the magazine comprises a guide profile for guiding the circuit modules in the row by their notch over the guide profile, while the rotation axis makes an angle of substantially ninety degrees with said edge of the carrier surface of the modules in the row.

11. An apparatus according to claim 10, wherein a distance between the rotation axis and the guide profile is less than a distance between the rotation axis and a surface of the press-on plate which comes into contact with the circuit module at the end of the row.

12. An apparatus according to claim 1, wherein the press-on member is adapted to be swung clear out of the magazine and to be swung back again into a portion of the magazine upstream of the row and is adapted to be slideable relative to the row.

13. An apparatus according to claim 12, wherein the press-on member comprises an energization which, when the press-on member is being swung clear, is de-energized and, after the press-on member has been swung back in again, gradually builds up the press-on force over a time interval of at least 1 second.

14. An apparatus according to claim 1, wherein the magazine comprises a press-on space with side profiles for guiding side notches in the circuit modules of the row and at most one bottom profile for guiding a notch in a lower side of the circuit modules and wherein the magazine comprises a loading space which via a transition zone continues into the press-on space, wherein a bottom of the magazine in the loading space comprises more than one guide profile for respective notches at the lower side of the circuit modules, and wherein the loading space does not comprise any side profiles.

15. An apparatus according to claim 1, arranged for picking up and testing circuit modules which are memory modules for PC's.

16. A method for testing circuit modules, wherein use is made of the apparatus according to claim 1.

* * * * *